(12) United States Patent
Lee (10) Patent No.: US 6,964,879 B2
(45) Date of Patent: Nov. 15, 2005

(54) METHOD OF FABRICATING A CONTACT

(75) Inventor: Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/708,524

(22) Filed: Mar. 9, 2004

(65) Prior Publication Data

US 2005/0106860 A1    May 19, 2005

(30) Foreign Application Priority Data

Nov. 17, 2003   (TW) .............................. 92132107 A (51) Int. Cl.[7] .............................................. H01L 21/00
(52) U.S. Cl. ..................... 438/95; 635/637; 635/666
(58) Field of Search ............................... 438/666, 635, 438/637, 95, 595

(56) References Cited

U.S. PATENT DOCUMENTS

| | | | |
|---|---|---|---|
| 5,015,604 A * | 5/1991 | Lim et al. .................... 438/601 |
| 5,432,128 A * | 7/1995 | Tsu .............................. 438/635 |
| 6,251,763 B1 * | 6/2001 | Inumiya et al. ............. 438/595 |
| 6,642,581 B2 * | 11/2003 | Matsuda et al. ............ 257/369 |
| 2003/0129818 A1 * | 7/2003 | Inai et al. .................... 438/595 |

* cited by examiner

Primary Examiner—Trung Dang (74) Attorney, Agent, or Firm—Jianq Chyun IP office (57) ABSTRACT

A method for fabricating a contact is provided. First, a substrate is provided. A patterned first material layer is formed over the substrate. The first material layer is fabricated using a conductive material. Thereafter, a treatment operation is performed to transform a portion of the first material layer into a second material layer with insulating properties. The second material layer is located on sidewall sections and a top section of the first material layer. A dielectric layer is formed over the second material layer and the substrate. A portion of the dielectric layer and the second material layer are removed to expose the first material layer. Because a treatment transformation is used to reduce the dimension of contacts, this invention eliminates the limitations associated with forming a contact through an etching process.

24 Claims, 8 Drawing Sheets

METHOD OF FABRICATING A CONTACT

CROSS REFERENCE TO RELATED APPLICATIONS

This application claims the priority benefit of Taiwan application serial no. 92132107, filed Nov. 17, 2003.

BACKGROUND OF INVENTION

1. Field of the Invention

The present invention relates to a method of fabricating a semiconductor device. More particularly, the present invention relates to a method of fabricating a contact.

2. Description of the Related Art

In semiconductor manufacturing, photolithographic and etching processes are often used to pattern out contacts. As the level of integration continues to increase, the critical dimensions of each device is reduced. In other words, using photolithographic and etching processes to pattern out very small contacts is increasingly difficult.

On the other hand, very small contacts are required in some applications. For example, micro contacts are fabricated inside a chalcogenide memory unit.

Chalcogenide memory is a type of non-volatile memory. Chalcogenide is a special type of material that undergoes a phase change (a transition from an amorphous state to a crystalline state) when subjected to heat so that data can be written into or erased from the memory unit. In a chalcogenide memory unit, the area of contact between the chalcogenide material and the electrode is called a chalcogenide active region. The active region is located within a contact opening so that the dimension of the active region is the size of the contact opening. When a current pulse passes through the active region, a phase change of the chalcogenide material inside the active region occurs. In general, current density of the current pulse is related to the area of the active region. When the contact opening is small, the active region is small and hence a large current density is produced. If the current density is large, the current required to program data into the chalcogenide memory unit is small.

Thus, with an increasing level of integration and the importance of forming micro contacts in the aforementioned area, several methods for fabricating micro contacts have been developed.

One method of fabricating a micro contact has been disclosed in U.S. Pat. No. 6,111,264. In this method, spacers are formed inside a contact opening to reduce an overall dimension of the contact. However, the spacers are formed in photolithograhic and etching processes. Due to the limitation of the photolithograhic and etching processes in the patterning of micro features, a spacer with an uniform thickness is hard to produce and the ultimate reduction of the contact size is quite limited.

Another method of fabricating a micro contact has been disclosed in U.S. Pat. No. 6,031,287. In this method, a hard mask layer with small openings is formed to serve as an etching mask to form the micro contact opening. Because the process of forming the hard mask layer still relies on the formation of spacers to reduce the size of openings, problems similar to the aforementioned disclosure still exist.

Yet another method of fabricating a micro contact has been disclosed in U.S. Pat. No. 6,114,713. In this method, a photoresist layer is formed over the areas predefined to form contacts. Thereafter, the photoresist layer is used as an etching mask to perform an isotropic etching operation so that a micro contact is formed underneath the photoresist layer. However, the size of the contacts obtained through this method tend to be non-uniformed due to considerable difficulties in controlling the etching operation.

Although the aforementioned methods can reduce the average size of contacts, each method has some limitations. Therefore, a method for forming micro contacts with as little setbacks as possible is still a major area of investigation in semiconductor production.

SUMMARY OF INVENTION

Accordingly, at least one object of the present invention is to provide a method for fabricating a contact that can eliminate process limitations resulting from the performance of photolithographic and etching processes to form a contact.

To achieve these and other advantages and in accordance with the purpose of the invention, as embodied and broadly described herein, the invention provides a method for fabricating a contact. First, a substrate is provided. A patterned first material layer is formed over the substrate. The first material layer is a conductive material. Thereafter, a treatment operation is performed to transform a portion of the first material layer into a second material layer. The second material layer is located on sidewall sections and a top section of the first material layer. Furthermore, the second material layer has an insulating property. A dielectric layer is formed over the second material layer and the substrate. Finally, a portion of the dielectric layer and the second material layer are removed to expose the first material layer.

This invention also provides an alternative method for fabricating a contact. First, a substrate is provided. A first material layer is formed over the substrate, wherein the first material layer includes a conductive material or a nonconductive material. Thereafter, a treatment operation is performed to transform a portion of the first material layer into a second material layer. The second material layer is located on sidewall sections and a top section of the first material layer. The second material layer has properties that differ from the first material layer including an insulating property. A dielectric layer is formed over the second material layer and the substrate. A portion of the dielectric layer and the second material layer is removed to expose the first material layer. If the first material layer is a nonconductive material, the method further includes removing the first conductive material layer to form a contact opening. Finally, a conductive material is deposited to fill the contact opening thereby forming a contact.

In the aforementioned methods, the first material layer is treated so that the top and the sidewall of the first material layer is transformed into the second material layer. This transformation reduces the size of the first material layer reserved for forming the contact so that a contact with diminished dimension is produced. Furthermore, using a transformation treatment eliminates the limitations associated with forming a contact through an etching process.

If the aforementioned treatment operation is an oxidation process, the oxidation rate decreases when thickness of the oxide layer increases. Hence, the transformation treatment not only reduces the size of the contact, but also provides a means of controlling the extent of contact size reduction by setting the processing duration and oxidation rate.

This invention also provides a third method for fabricating a contact. First, a substrate having at least one linear stack structure thereon is provided. The linear stack structure comprises a bottom conductive layer and a top first material layer. The first material layer is a conductive layer. Thereafter, a first dielectric layer is formed over the substrate such that a top section of the linear stack structure is exposed. At least one linear conductive layer is formed over the linear stack structure. The linear conductive layer is aligned in a direction perpendicular to the linear stack structure. The first material layer not covered by the linear conductive layer is removed to expose the conductive layer. A treatment operation is performed to transform a portion of the first material layer into a second material layer. The second material layer is located on sidewall sections of the first material layer. Furthermore, the second material layer has an insulating property.

This invention also provides a fourth method for fabricating a contact. First, a substrate having at least one linear stack structure thereon is provided. The linear stack structure comprises a bottom conductive layer and a top first material layer. A first dielectric layer is formed over the substrate. The first dielectric layer exposes the top section of the linear stack structure. Thereafter, at least one linear sacrificial layer is formed over the linear stack structure. The linear sacrificial layer is aligned in a direction perpendicular to the linear stack structure. The first material layer not covered by the linear sacrificial layer is removed to expose the conductive layer. A treatment operation is performed to transform a portion of the first material layer into a second material layer. The second material layer is located on sidewall sections of the first material layer. The second material layer has material properties that differ from the first material layer. The second material layer has an insulating property. After removing the linear sacrificial layer, a second dielectric layer is formed over the substrate to cover the conductive layer and expose the top sections of the first material layer and the second material layer. This method further includes removing the first material layer to form a plurality of contact openings. Finally, a conductive material is deposited to fill the contact openings.

In the third and the fourth methods, the linear sacrificial layers serve as a self-aligned mask that retains the first material layer for forming the contact. Hence, the dimension of the contact is determined by the size of the linear sacrificial layer. In a subsequent step, a treatment of the first material layer is performed to reduce overall dimension of the first material layer. Ultimately, a contact with micro dimension is produced. Since a treatment operation is utilized, all the limitations associated with an etching process for forming a micro contact are avoided.

Moreover, each contact in the array of contacts fabricated using the aforementioned methods can have a high degree of uniformity. Furthermore, the amount of reduction from an original contact dimension can be controlled through a proper setting of various treatment parameters.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1A:
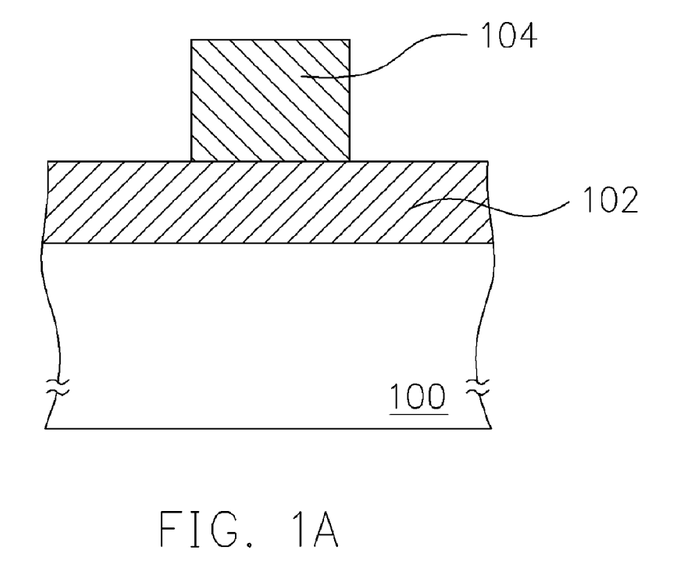
FIGS. 1A through 1D are schematic cross-sectional views showing the progression of steps for fabricating a contact according to a first preferred embodiment of this invention.

FIGS. 1A through 1D are schematic cross-sectional views showing the progression of steps for fabricating a contact according to a first preferred embodiment of this invention. As shown in FIG. 1A, a substrate 100 having a plurality of devices (not shown) thereon is provided. The devices on the substrate 100 include diodes or MOS transistors, for example. In this embodiment, the substrate 100 also has a conductive layer 102 already formed thereon. The conductive layer 102 is fabricated using a metallic or conductive material, for example. In this embodiment, the conductive layer 102 is a metallic layer such as a tungsten layer. In an alternative embodiment of this invention, the conductive layer 102 is the lower electrode of a memory device, for example. Thereafter, a patterned material layer 104 is formed over the conductive layer 102. The material layer 104 is fabricated using, for example, a conductive or a non-conductive material having the capacity to be transformed into an insulating material in a subsequent treatment process. In one embodiment, the material layer 104 is fabricated using either a metallic, silicon or high molecular weight material. If a metallic material is used to fabricate the material layer 104, the metallic material is preferably aluminum or copper.

Figure 1B:
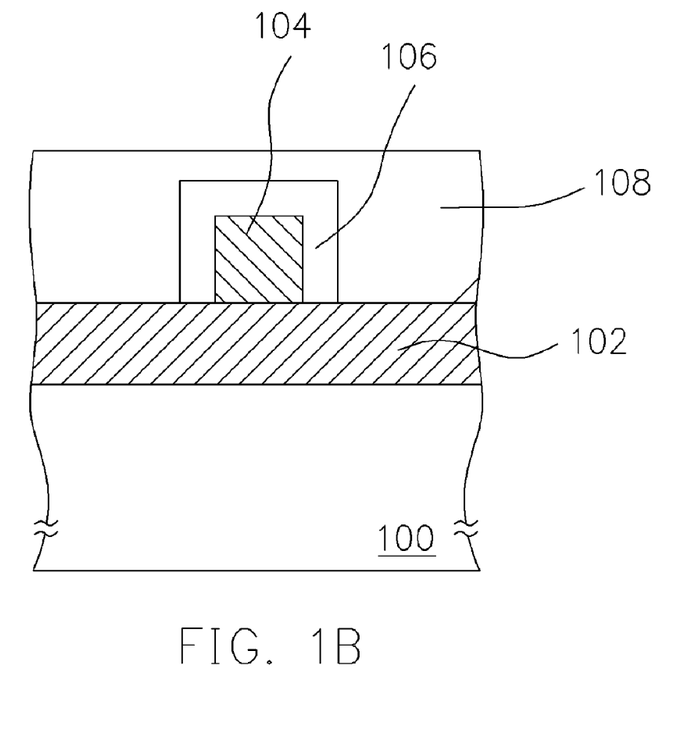

As shown in FIG. 1B, a treatment process is performed to transform a portion of the material layer 104 into another material layer 106. The material layer 106 is formed on sidewall sections and a top section of the material layer 104. The material layers 104 and 106 have different properties. In fact, the material layer 106 has an insulating property that has little effect on subsequent processes. The treatment process includes a chemical reaction in which the speed of the reaction is limited by a diffusion mechanism. The treatment process includes an oxidation process, a nitridation process, hydrogenation process or fluoridation process, for example. A reaction gas for the oxidation process includes, for example, an oxygen gas, an ozone gas or an oxygen gas/water. Meanwhile, a reaction gas for the nitridation process includes, for example, nitric oxide, nitrous oxide or ammonia, while a reaction gas for the hydrogenation process is a hydrogen gas.

In one embodiment of this invention, the material layer 104 is aluminum, for example. Furthermore, a portion of the metallic aluminum is transformed into insulating aluminum oxide (the material layer 106) through an oxidation process. The oxidation process proceeds from the surface of the aluminum material layer 104. In general, the thicker the aluminum oxide layer 106 the slower will be the rate of oxidation so that the transformation of aluminum to aluminum oxide material slows down with an increase in the thickness of the aluminum oxide layer 106. Thus, thickness of the final aluminum oxide layer 106 is easy to control and self-limiting effect is also attained. In other words, the method in this invention not only reduces the dimension of the contacts, but also permits an accurate degree of reduction by controlling the duration and speed of the treatment operation.

Thereafter, as shown in FIG. 1B, a dielectric layer 108 is formed over the material layer 106 and the substrate 100. The dielectric layer 108 is a silicon oxide layer formed, for example, by performing a chemical vapor deposition (CVD).

Figure 1C:
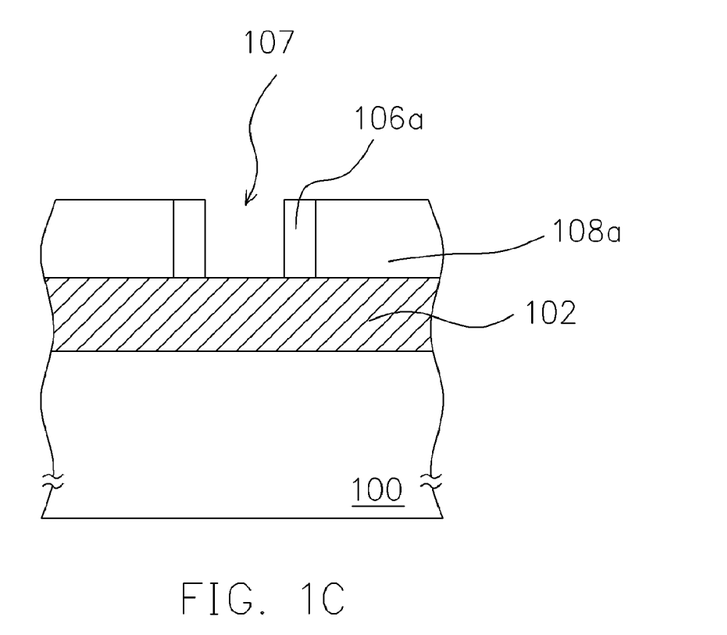

As shown in FIG. 1C, the dielectric layer 108 and the material layer 106 on the top section of the material layer 104 are removed to expose the material layer 104 and form a material layer 106a and a dielectric layer 108a. The dielectric layer 108 and the material layer 106 are removed, for example, by performing a chemical-mechanical polishing (CMP) operation. Thereafter, the material layer 104 is removed to form a contact opening 107. The material layer 104 is removed, for example, by performing a wet etching process using an etchant with a different etching selectivity between the material layer 104 and the material layer 106a.

Figure 1D:
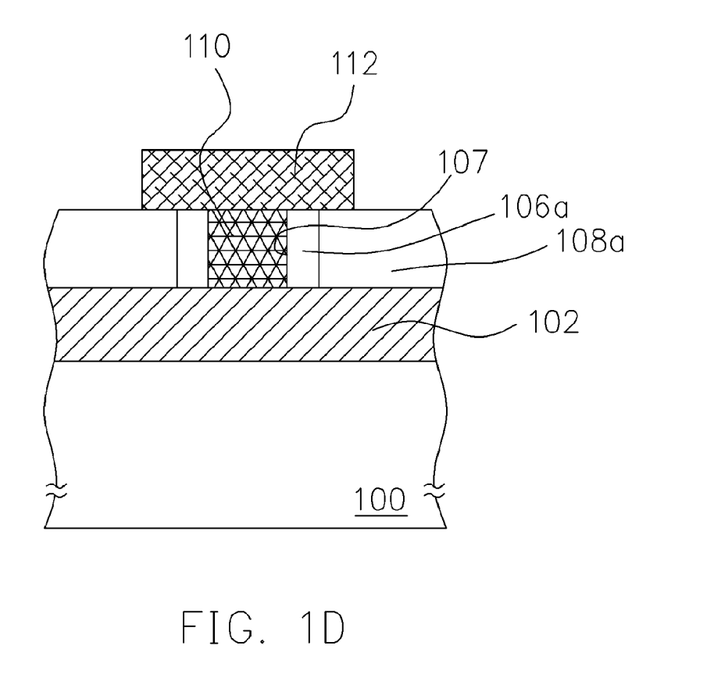

As shown in FIG. 1D, a conductive material is deposited into the contact opening 107 to form a contact 110. The conductive material can be tungsten or polysilicon, for example.

Subsequent fabrication processes includes forming a conductive layer 112 over the dielectric layer 108a such that the conductive layer 112 and the contact 110 are electrically connected (as shown in FIG. 1D). In another embodiment, the conductive layer 112 can be the upper electrode of a memory device, for example.

In another preferred embodiment, if the material layer 104 is fabricated using a conductive material, the material layer 104 may be chosen to become a contact. In other words, there is no need to remove the material layer 104 before forming the conductive layer 112.

In the aforementioned method, the material layer 104 is treated so that the top and the sidewall of the material layer 104 is transformed into the material layer 106. This transformation reduces the size of the material layer 104 reserved for forming the contact so that a contact with diminished dimension is produced. Furthermore, using a transformation treatment eliminates the limitations associated with forming a contact through an etching process.

If the aforementioned treatment operation is an oxidation process, the oxidation rate decreases when the thickness of the oxide layer increases. Hence, the transformation treatment not only reduces the size of the contact, but also provides a means of controlling the extent of contact size reduction by setting the processing duration and oxidation rate. In other words, the amount of reduction from an original contact dimension can be controlled through a proper setting of various treatment parameters.

Figure 2A:
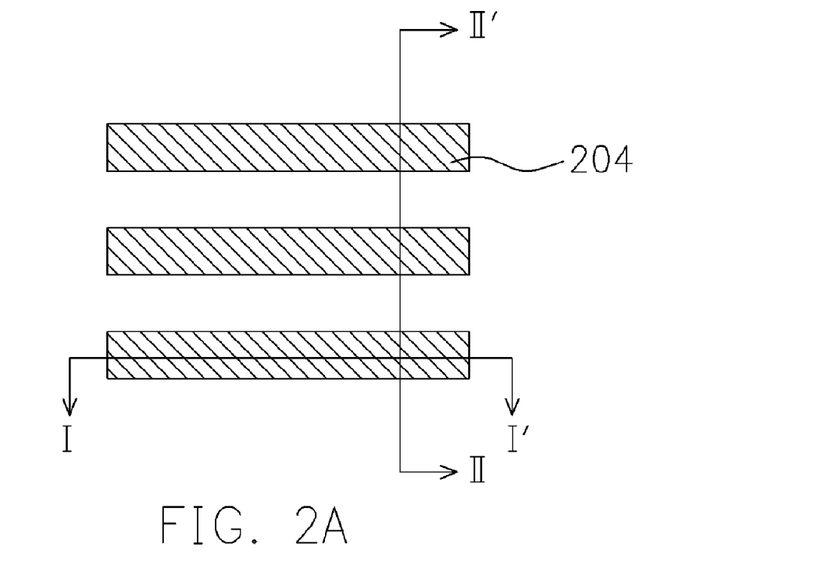
FIGS. 2A through 2D are schematic top views showing the progression of steps for fabricating a contact according to a second preferred embodiment of this invention.

FIGS. 2A through 2D are schematic top views showing the progression of steps for fabricating a contact according to a second preferred embodiment of this invention. FIGS. 3A through 3D are schematic cross-sectional view along line I–I" of FIGS. 2A through 2D showing the progression of steps for fabricating a contact according to the second preferred embodiment of this invention. FIGS. 4A through 4D are schematic cross-sectional view along line II–II" of FIGS. 2A through 2D showing the progression of steps for fabricating a contact according to the second preferred embodiment of this invention. As shown in FIGS. 2A, 3A and 4A, a substrate 200 having a plurality of devices (not shown) thereon is provided. The devices on the substrate 200 are diodes or MOS transistor, for example. Furthermore, the substrate 200 has a plurality of linear stack structures 203 thereon. Each linear stack structure 203 comprises a bottom conductive layer 202 and a top material layer 204. The material layer 204 is fabricated using a conductive material or a non-conductive material. Since the properties of the material layer 204 are identical to the material layer 104 in the first embodiment of this invention, detailed description is not repeated here. In another embodiment of this invention, the material layer 204 can be the bottom electrode of a memory device, for example.

Thereafter, as shown in FIGS. 2A, 3A and 4A, a dielectric layer 208 is formed over the substrate 200 such that the dielectric layer 208 exposes all top sections of the linear stack structures 203. The dielectric layer 208 is formed, for example, by depositing a silicon oxide material over the linear stack structures 203 in a chemical vapor deposition process and planarizing the silicon oxide dielectric layer to expose the top sections of the linear stack structures 203. The dielectric layer 208 is planarized, for example, by performing a chemical-mechanical polishing operation or an etching back operation.

Figure 2B:
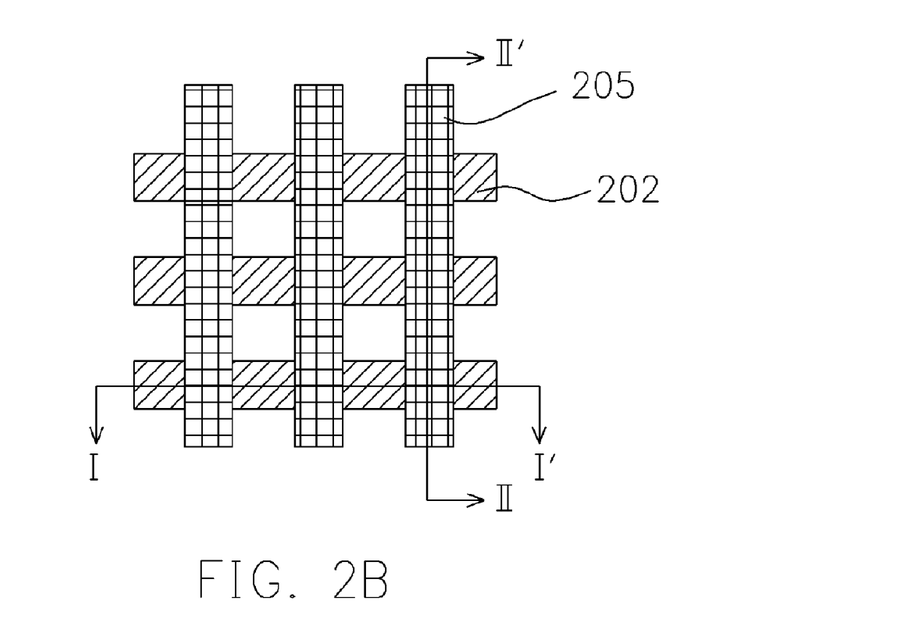
Figure 3A:
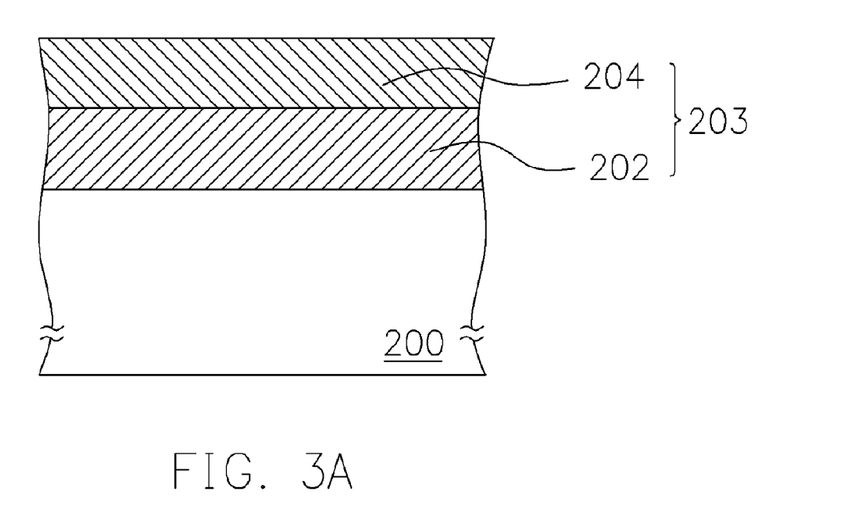
FIGS. 3A through 3D are schematic cross-sectional view along line I–I' of FIGS. 2A through 2D showing the progression of steps for fabricating a contact according to the second preferred embodiment of this invention.
Figure 3B:
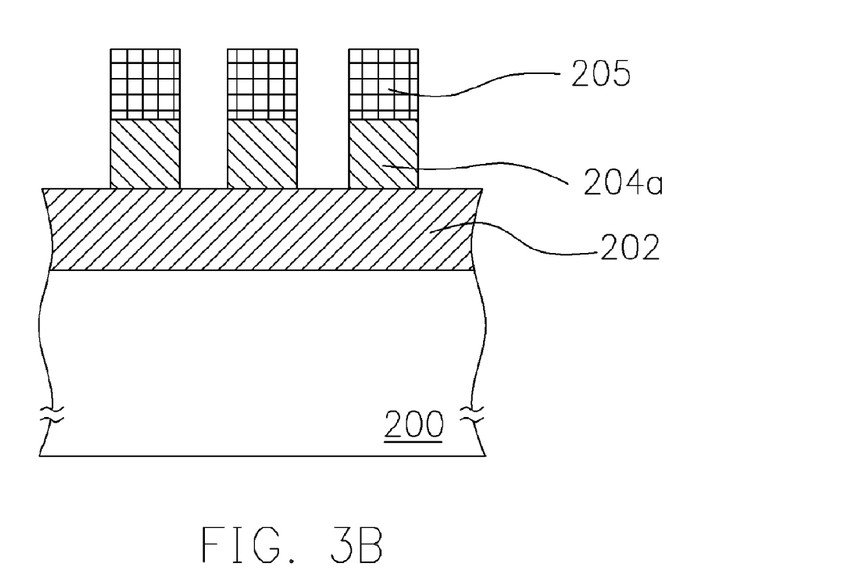
Figure 4A:
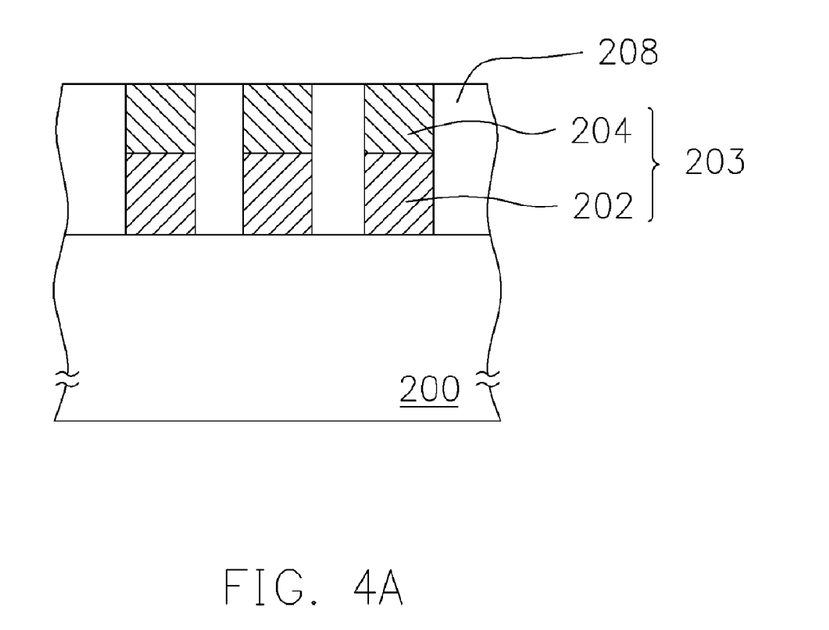
FIGS. 4A through 4D are schematic cross-sectional view along line II–II' of FIGS. 2A through 2D showing the progression of steps for fabricating a contact according to the second preferred embodiment of this invention.
Figure 4B:
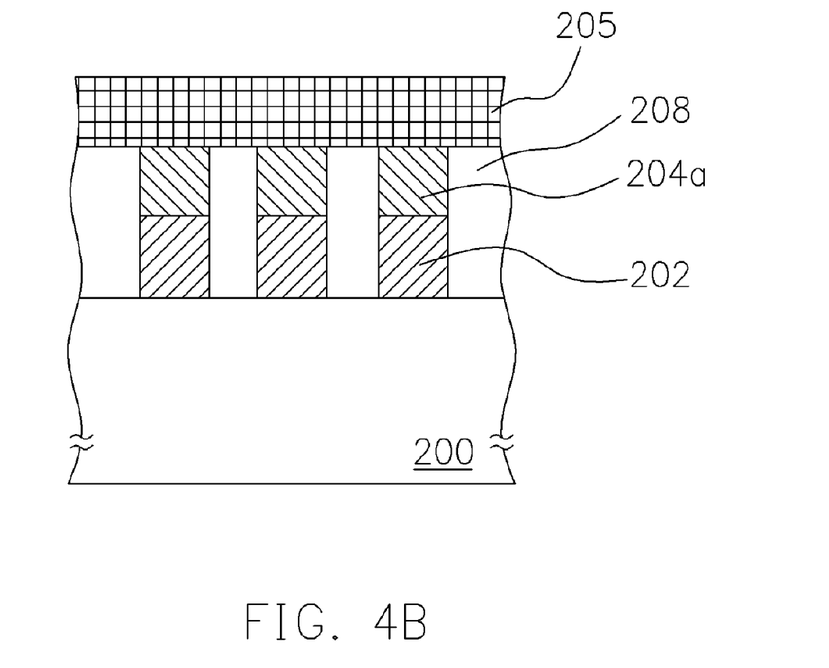

As shown in FIGS. 2B, 3B and 4B, a plurality of linear sacrificial layers 205 is formed over the linear stack structures 203. The linear sacrificial layers 205 are oriented in a direction perpendicular to the linear stack structures 203. The linear sacrificial layers is fabricated using a material having different etching properties from the linear stack structures 203 or the dielectric layer 208. To form the linear sacrificial layers 205, a sacrificial material layer (not shown) is formed over the substrate 200 to cover the dielectric layer 208 and the linear stack structures 203 and then photolithographic and etching processes are performed. Thereafter, the material layer 204 not covered by the linear sacrificial layers 205 is removed to expose the conductive layer 202. The exposed material layer 204 is removed using the linear sacrificial layers 205 as self-aligned masks in an etching operation. Consequently, a portion of the material layer 204 at the overlapping area between the linear sacrificial layer 205 and the conductive layer 202 is retained as a material layer 204a. The retained material layer 204a has a dimension exactly the size of the would-be contact.

Note that the linear sacrificial layers 205 serve as self-aligned masks to retain the material layer 204a for forming the contact subsequently. In other words, dimension of the material layer 204a (the contact size) can be controlled through the linear sacrificial layers 205.

Figure 2C:
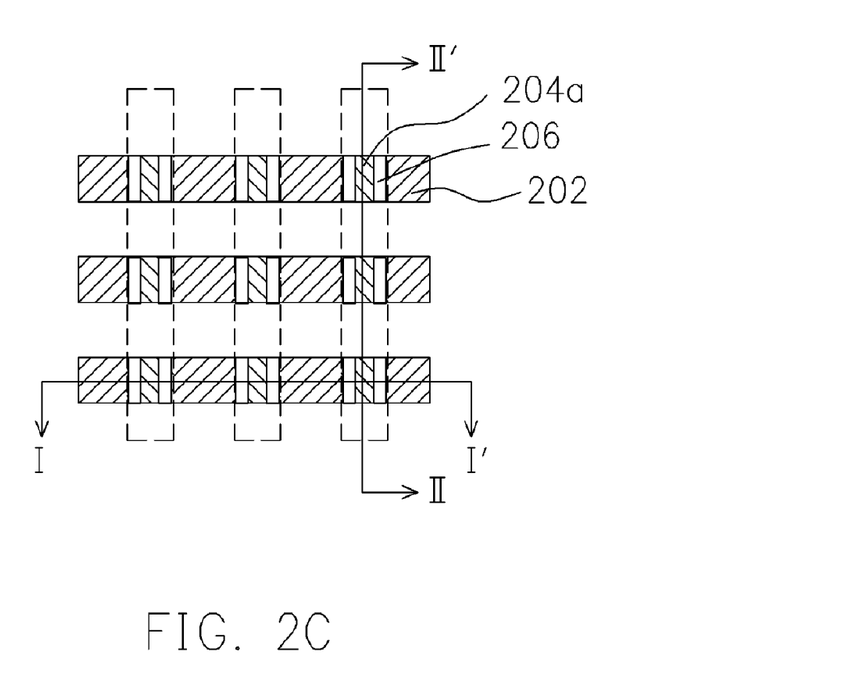
Figure 3C:
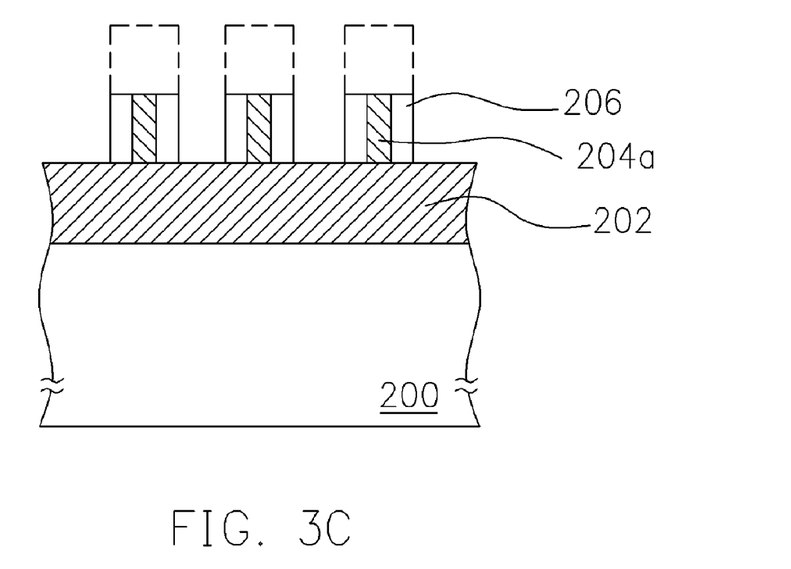
Figure 4C:
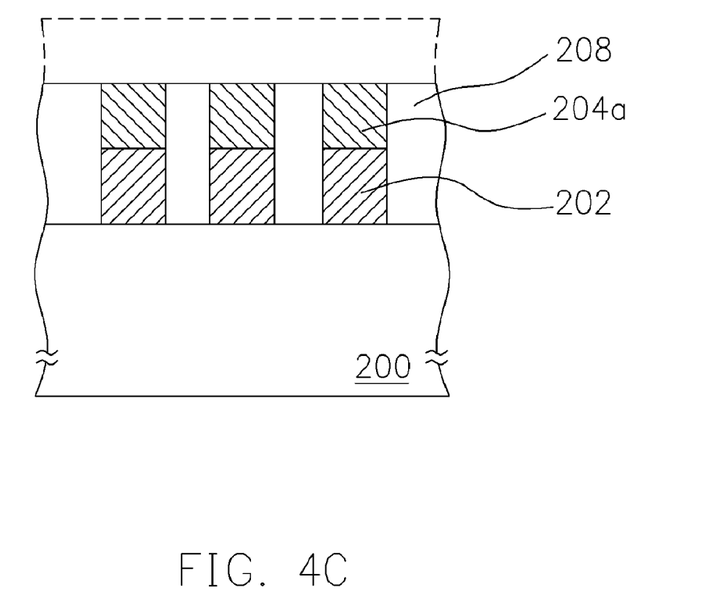

As shown in FIGS. 2C, 3C and 4C, a treatment operation is performed to transform a portion of the material layer 204a into another material layer 206. The material layer 206 is located on the sidewalls of the material layer 204a. Furthermore, the material layers 204a and 206 have different physical properties. The transformed material layer 206 is an insulator and none of its properties has any adverse effects on subsequent fabrication processes. Since the transformation treatment is identical to the first embodiment, detailed description of the material layer 206 is omitted. Thereafter, the linear sacrificial layers 205 are removed to expose the top sections of the material layer 204a and the material layer 206.

Figure 2D:
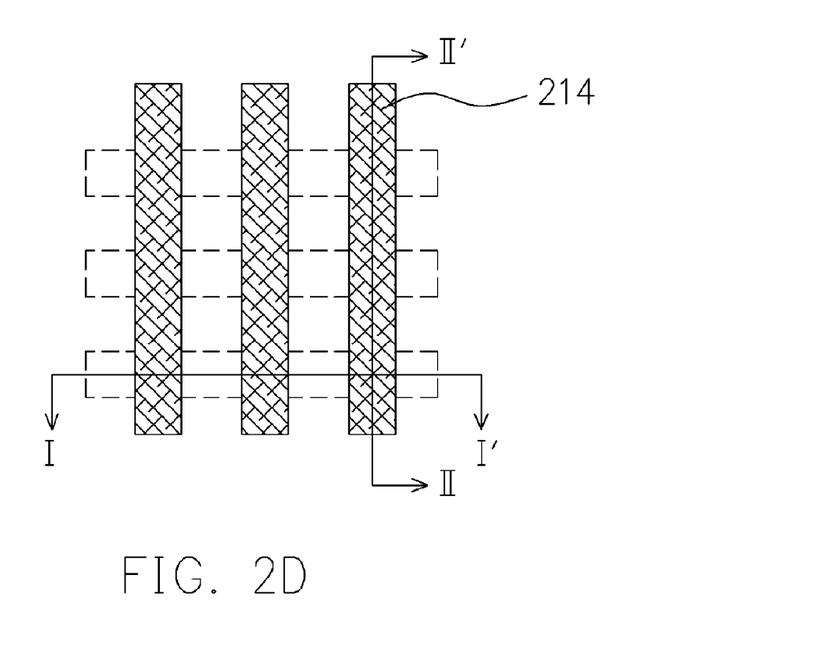
Figure 3D:
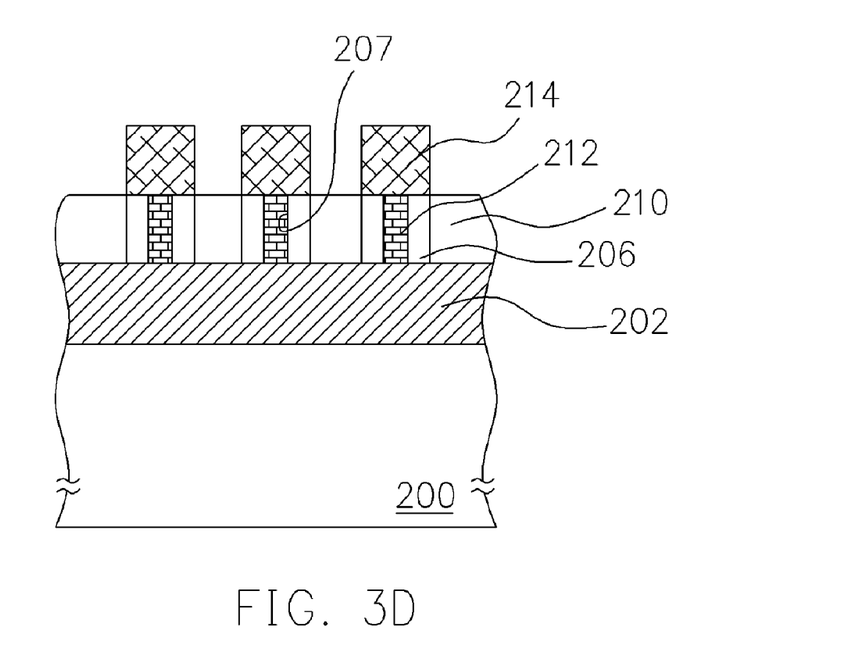
Figure 4D:
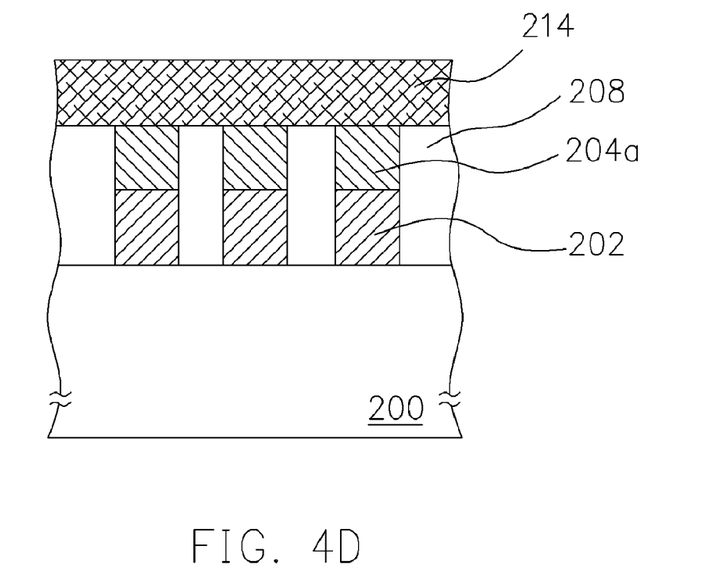

As shown in FIGS. 2D, 3D and 4D, a dielectric layer 210 is formed over the substrate 200 to cover the conductive layer 202 and expose the top sections of the material layer 204a and the material layer 206. The dielectric layer 210 is formed, for example, by depositing silicon oxide over the top sections of the material layers 204a and 206 and the conductive layer 202 in a chemical vapor deposition process and planarizing the silicon oxide dielectric layer to expose the top sections of the material layers 204a and 206. The dielectric layer 210 is planarized, for example, by performing a chemical-mechanical polishing operation or an etching back operation. Thereafter, the material layer 204a is removed to form a plurality of contact openings 207. The material layer 204a is removed, for example, by performing a wet etching process. After forming the contact openings 207, a conductive material is deposited into the contact openings 207 to form an array of contacts 212. The conductive material deposited into the contact openings 207 includes tungsten or polysilicon, for example.

Subsequent to the above treatment process, the contact fabrication process as shown in FIGS. 2C and 2D can further include the following process step. A dielectric layer 210 is formed over the substrate 200 to cover the linear sacrificial layer 205. Further, the dielectric layer 210 exposes the liner sacrificial layer 205. Thereafter, the linear sacrificial layer 205 is removed to expose the top sections of the material layer 204a and the material layer 206.

Subsequent fabrication processes includes forming a conductive layer 214 over the dielectric layers 210 and 208 such that the conductive layer 214 and the contact 212 are electrically connected (as shown in FIGS. 2D, 3D and 4D). In another embodiment, the conductive layer 214 can be the upper electrode of a memory device, for example.

In another embodiment, if the material layer 204a is fabricated from a conductive material and the linear sacrificial layer 205 is fabricated from a thermal conductive material, the material layers 204a can serve as contacts and the linear sacrificial layers 205 can serve as conductive layers by selection. In this case, the fabrication process finishes after performing the steps as shown in FIG. 2C. In other words, there is no need to remove the linear sacrificial layers 205 and for the processes thereafter.

In another embodiment, if the material layer 204a is fabricated from a non-conductive material, the linear sacrificial layers 205 must be removed. Furthermore, after removing the material layer 204a, conductive material must be deposited into the contact opening 207. The conductive material includes tungsten or polysilicon, for example.

In yet another embodiment, if the material layer 204a is fabricated from a conductive material but the ultimately required conductive layer 214 is fabricated from a non-refractory conductive material (for example, chalcogenide), the linear sacrificial layer 205 must be removed. In a subsequent step, the material layers 204a can serve as contacts by selection and the conductive layer 214 is formed directly on the material layers 204a. In other words, there is no need to remove the material layer 204a before forming the conductive layer 214.

In yet another embodiment, if the degree of conductivity of the material layer 204a is not being considered, the ultimate required conductive layer 214 is fabricated from a non-refractory conductive material (for example, chalcogenide), the linear sacrificial layers 205 must be removed. In a subsequent step, the material layer 204a is removed, followed by filling the contact with the conductive layer 214. In other words, after removing the material layer 204a, the conductive layer 214 is formed.

In this invention, the linear sacrificial layers 205 serve as self-aligned masks to retain the material layer 204a for forming the contacts. Hence, the dimension of the contact can be determined by the size of the linear sacrificial layers.

Furthermore, the material layer 204a is processed in a subsequent step that can provide a self-limiting effect to reduce the dimension of the material layer 204a so that a micro contact is obtained. Hence, using a transformation treatment eliminates the limitations associated with forming a contact through an etching process.

For example, if the linear sacrificial layer 205 has a width of about 0.18 $\mu$m, the retained material layer 204a after etching has a dimension of about 0.18 $\mu$m. Thereafter, in the oxidation process to transform a portion of the material layer 204a on the sidewalls into a material layer 206, the material layer 206 has a thickness of about 0.05 $\mu$m. Ultimately, the dimension of the material layer 204a is reduced to 0.08 $\mu$m, a reduction of 55.6%.

Moreover, each contact in the array of contacts fabricated using the aforementioned methods can have a high degree of uniformity. Furthermore, the amount of reduction from an original contact dimension can be controlled through a proper setting of various treatment parameters.

The aforementioned method for fabricating a contact can also be applied to form a chalcogenide memory unit. The chalcogenide memory unit has a bottom electrode fabricated from a conductive layer (102 or 202) and a top electrode fabricated from another conductive layer (112 or 214). The chalcogenide material layer sandwiched between the top and the bottom electrode is electrically connected to the bottom electrode via a contact (107 or 207).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a contact, comprising the steps of:
   providing a substrate;
   forming a patterned first material layer over the substrate, wherein the patterned first material layer comprises a metal;
   performing a treatment process to transform a portion of the patterned first material layer into a second material layer, wherein the second material layer is formed on sidewall sections and a top section of the patterned first material layer;
   forming a dielectric layer over the second material layer and the substrate;
   removing a portion of the dielectric layer and the second material layer to expose the first material layer; and
   removing a remaining portion of the patterned first material layer to form a contact opening.

2. The method of claim 1, wherein the first conductive material comprises aluminum or copper.

3. The method of claim 1, wherein the treatment process includes a chemical reaction in which a speed of the reaction is limited by a diffusion mechanism.

4. The method of claim 3, wherein the chemical reaction is an oxidation process, a nitridation process, a hydrogenation process or a fluorination process.

5. The method of claim 1, wherein the second conductive material comprises chalcogenide.

6. A method for fabricating a contact, comprising the steps of:
   providing a substrate having at least one linear stack structure thereon such that the linear stack structure comprises a bottom conductive layer and a top first material layer, wherein the first material layer is fabricated from a first conductive material;

forming a first dielectric layer over the substrate such that the first dielectric layer exposes a top section of the linear stack structure;

forming at least one linear conductive layer over the linear stack structure such that the linear conductive layer is oriented in a direction perpendicular to the linear stack structure;

removing the first material layer not covered by the linear conductive layer to expose the conductive layer; and performing a treatment process to transform a portion of the first material layer into a second material layer with an insulating property, wherein the second material layer is formed on the sidewall section of the first material layer.

7. The method of claim 6, wherein the first conductive material comprises a substance selected from the group Consisting of aluminum, silicon and copper.

8. The method of claim 6, wherein the treatment process includes a chemical reaction in which a speed of the reaction is limited by a diffusion mechanism.

9. The method of claim 8, wherein the chemical reaction is an oxidation process, a nitridation process, a hydrogenation process or a fluorination process.

10. The method of claim 6, wherein the method for removing the first material layer not covered by the linear conductive layers comprises etching using the linear conductive layers as self-aligned masks.

11. A method for fabricating a contact, comprising:

providing a substrate having at least one linear stack structure thereon such that the linear stack structure comprises a bottom conductive layer and a top first material layer;

forming a first dielectric layer over the substrate such that the first dielectric layer exposes a top section of the linear stack structure;

forming at least one linear sacrificial layer over the linear stack structure such that the linear sacrificial layers are oriented in a direction perpendicular to the linear stack structure;

removing the first material layer not covered by the linear sacrificial layer to expose the conductive layer;

performing a treatment process to transform a portion of the first material layer into a second material layer with insulating properties, wherein the second material layer is formed on sidewall sections of the first material layer and the second material layer has properties different from the first material layer;

removing the linear sacrificial layers; and forming a second dielectric layer over the substrate to cover the conductive layer but expose top sections of the first material layer and the second material layer.

12. The method of claim 11, wherein subsequent to the step of exposing the top sections of the first material and the second material layer, the method further comprises:

removing the first material layer to form a plurality of contact openings; and depositing a conductive material into the contact openings to form an array of contacts.

13. The method of claim 11, wherein subsequent to the treatment process, the method further comprises:

forming a second dielectric layer on the substrate to cover the linear sacrificial layer but expose the top sections of the linear sacrificial layer;

removing the linear sacrificial layer; and exposing the top sections of the first material layer and the second material layer.

14. The method of claim 13, wherein subsequent to the step of exposing the top sections of the first material and the second material layer, the method further comprises removing the first material layer to form a plurality of contact openings; and depositing a conductive material into the contact openings to form an array of contacts.

15. The method of claim 11, wherein the first material layer comprises a polymer material.

16. The method of claim 11, wherein the first material layer comprises a substance selected from the group consisting of aluminum, silicon and copper.

17. The method of claim 11, wherein the treatment process includes a chemical reaction in which a speed of the reaction is limited by a diffusion mechanism.

18. The method of claim 16, wherein the chemical reaction is an oxidation process, a nitridation process, a hydrogenation process or a fluorination process.

19. The method of claim 13, wherein the conductive material comprises chalcogenide.

20. The method of claim 11, wherein the method of removing the first material layer not covered by the linear sacrificial layer comprises etching using the linear sacrificial layers as self-aligned masks.

21. A method for fabricating a contact, comprising the steps of:

providing a substrate;

forming a patterned first material layer over the substrate;

performing a treatment process to transform a portion of the patterned first material layer into a second material layer, wherein the second material layer is formed on sidewall sections and a top section of the patterned first material layer;

forming a dielectric layer over the second material layer and the substrate;

removing a portion of the dielectric layer and the second material layer to expose the first material layer;

removing a remaining portion of the patterned first material layer to form a contact opening; and depositing a chalcogenide layer into the contact opening to form a contact.

22. The method of claim 21, wherein the patterned first material layer comprises a substance selected from the group consisting of aluminum, silicon and copper.

23. The method of claim 21, wherein the treatment process includes a chemical reaction in which a speed of the reaction is limited by a diffusion mechanism.

24. The method of claim 21, wherein the chemical reaction is an oxidation process, a nitridation process, a hydrogenation process or a fluorination process.

* * * * *